United States Patent
Jeong et al.

(10) Patent No.: US 9,954,164 B2
(45) Date of Patent: Apr. 24, 2018

(54) METHODS FOR MANUFACTURING MAGNETIC MEMORY DEVICES

(71) Applicants: Daeeun Jeong, Yongin-si (KR); Yoonjong Song, Seoul (KR)

(72) Inventors: Daeeun Jeong, Yongin-si (KR); Yoonjong Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/588,776

(22) Filed: May 8, 2017

(65) Prior Publication Data

US 2018/0006215 A1 Jan. 4, 2018

(30) Foreign Application Priority Data

Jun. 29, 2016 (KR) .................. 10-2016-0081655

(51) Int. Cl.
*H01L 21/00* (2006.01)
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC ......... H01L 43/02; H01L 43/10; H01L 43/08; H01L 43/12; H01L 27/222; H01L 27/228; G11C 11/1675; G11C 11/161; G11C 11/1657; G11C 11/1673; G11C 11/1655
See application file for complete search history.

(56) References Cited

U.S. PATENT DOCUMENTS

| 6,544,801 | B1 | 4/2003 | Slaughter et al. |
| 7,045,841 | B2 | 5/2006 | Hong et al. |
| 8,202,572 | B2 | 6/2012 | Zhao et al. |
| 8,878,318 | B2 | 11/2014 | Chen et al. |
| 9,054,302 | B2 | 6/2015 | Doyle et al. |
| 9,059,389 | B2 | 6/2015 | Hu |
| 9,065,041 | B2 | 6/2015 | Kariyada et al. |
| 9,276,201 | B2 | 3/2016 | Pi et al. |
| 9,640,755 | B2 * | 5/2017 | Lee .................. H01L 43/08 |
| 9,842,637 | B2 * | 12/2017 | Kim .................. H01L 43/08 |
| 9,859,488 | B2 * | 1/2018 | Lee .................. H01L 43/02 |
| 2007/0277910 | A1 | 12/2007 | Ochiai et al. |
| 2013/0075839 | A1 * | 3/2013 | Chen .................. H01L 43/08 257/421 |
| 2016/0093670 | A1 | 3/2016 | Jiang et al. |

* cited by examiner

*Primary Examiner* — Thanh Y Tran
(74) *Attorney, Agent, or Firm* — Ward and Smith, P.A.

(57) ABSTRACT

Disclosed is a method for manufacturing a magnetic memory device. The method for manufacturing a magnetic memory device comprises sequentially forming a first magnetic layer, a tunnel barrier layer, and a second magnetic layer on a substrate, forming a boron absorption layer on the second magnetic layer, sequentially forming a metal capping layer and an oxygen donor layer on the boron absorption layer, and performing a heat treatment process to diffuse at least a portion of oxygen atoms included in the oxygen donor layer into the metal capping layer and the boron absorption layer. The metal capping layer has a greater oxygen diffusivity than the oxygen donor layer.

20 Claims, 13 Drawing Sheets

METHODS FOR MANUFACTURING MAGNETIC MEMORY DEVICES

CROSS-REFERENCE TO RELATED APPLICATIONS

This U.S. nonprovisional patent application claims priority under 35 U.S.C § 119 of Korean Patent Application 10-2016-0081655 filed on Jun. 29, 2016, the entire contents of which are hereby incorporated by reference.

BACKGROUND

The present disclosure relates to a method for manufacturing a magnetic memory device and, more particularly, to a method for manufacturing a magnetic memory device including a magnetic layer having perpendicular magnetization.

As electronic devices trend toward higher speed and lower power consumption, high-speed read/write operations and low operating voltages are required for semiconductor memory devices incorporated therein. In order to meet these requirements, magnetic memory devices have been developed as semiconductor memory devices. Since magnetic memory devices may operate at high speed and have non-volatile characteristics, they have attracted considerable attention as next generation memory devices.

A magnetic memory device may include a magnetic tunnel junction (MTJ). The magnetic tunnel junction may include two magnetic layers and an insulation layer interposed therebetween, and the resistance of the magnetic tunnel junction may vary depending on magnetization directions of the two magnetic layers. Specifically, the magnetic tunnel junction may have a relatively high resistance when the magnetization directions of the two magnetic layers are anti-parallel to each other, and may have a relatively low resistance when the magnetization directions of the two magnetic layers are parallel to each other. The magnetic memory device may write/read data using the resistance difference of the magnetic tunnel junction.

SUMMARY

Embodiments of the present inventive concepts provide a method for manufacturing a magnetic memory device having enhanced reliability and yield.

According to exemplary embodiments of the present inventive concept, a method for manufacturing a magnetic memory device may include: sequentially forming a first magnetic layer, a tunnel barrier layer, and a second magnetic layer on a substrate; forming a boron absorption layer on the second magnetic layer; sequentially forming a metal capping layer and an oxygen donor layer on the boron absorption layer, the metal capping layer having a greater oxygen diffusivity than the oxygen donor layer; and performing a heat treatment process to diffuse at least a portion of oxygen atoms contained in the oxygen donor layer into the metal capping layer and the boron absorption layer.

According to other exemplary embodiments of the present inventive concept, a method for manufacturing a magnetic memory device may include: sequentially forming an oxygen donor layer and a metal capping layer on a substrate, the metal capping layer including a greater oxygen diffusivity than the oxygen donor layer; forming a boron-absorption layer on the metal capping layer; sequentially forming a first magnetic layer, a tunnel barrier layer, and a second magnetic layer on the boron absorption layer; and performing a heat treatment process to diffuse at least a portion of oxygen atoms contained in the oxygen donor layer into the metal capping layer and the boron absorption layer and to diffuse at least a portion of boron atoms contained in the first magnetic layer into the boron absorption layer.

According to yet other exemplary embodiments of the present inventive concept, a method for manufacturing a magnetic memory device may include: forming an interlayer dielectric layer on a substrate; forming at least one contact plug to penetrate the interlayer dielectric layer; sequentially forming a first magnetic layer, a tunnel barrier layer, and a second magnetic layer on the interlayer dielectric layer and the at least one contact plug; forming a boron absorption layer on the second magnetic layer; performing a first heat treatment process wherein at least a portion of boron atoms contained in the second magnetic layer diffuse into the boron absorption layer as a result of the first heat treatment process; sequentially forming a metal capping layer and an oxygen donor layer on the boron absorption layer, the metal capping layer having a greater oxygen diffusivity than the oxygen donor layer; and performing a second heat treatment process to diffuse at least a portion of oxygen atoms contained in the oxygen donor layer into the metal capping layer and the boron absorption layer.

DETAILED DESCRIPTION OF EMBODIMENTS

Figure 1:
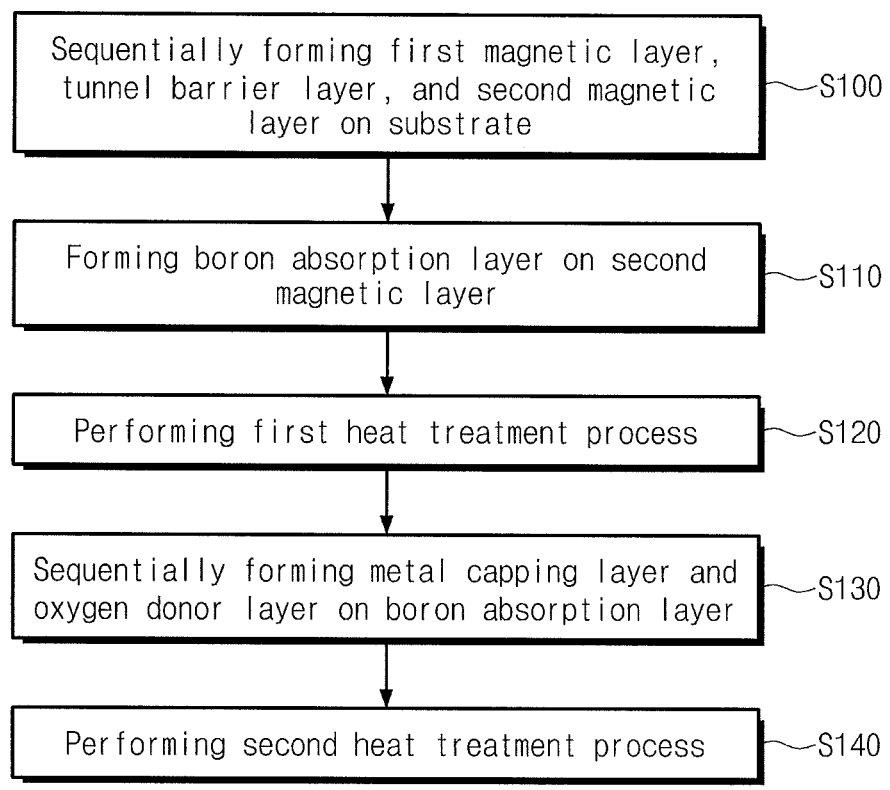
FIG. 1 is a flow chart illustrating a method for manufacturing a magnetic memory device according to exemplary embodiments of the present inventive concept.

The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept.

In the specification, it will be understood that when an element is referred to as being "on" another element, layer or substrate, it can be directly on the other element, or intervening elements may also be present. In the drawings, thicknesses of elements are exaggerated for clarity of illustration.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be described in detail about the present inventive concept by explaining exemplary embodiments thereof in conjunction with the accompanying drawings.

FIG. 1 is a flow chart illustrating a method for manufacturing a magnetic memory device according to exemplary embodiments of the present inventive concept. FIGS. 2A to 2G are cross-sectional views illustrating a method for manufacturing a magnetic memory device according to exemplary embodiments of the present inventive concept. FIG. 3 is a flow chart illustrating a method for manufacturing a magnetic memory device according to exemplary embodiments of the present inventive concept.

Figure 2A:
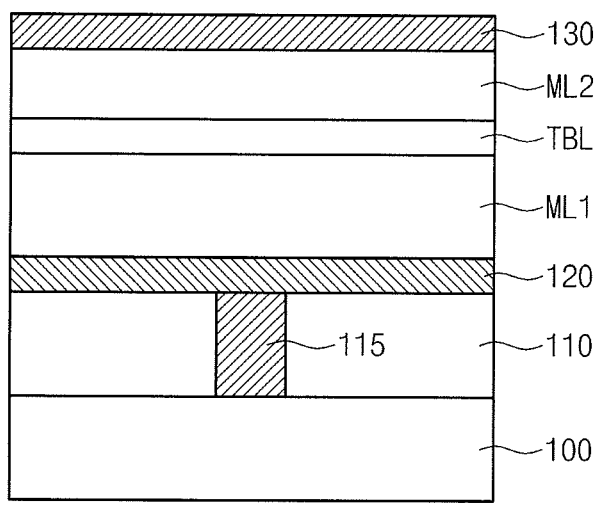
FIGS. 2A to 2G are cross-sectional views illustrating a method for manufacturing a magnetic memory device according to exemplary embodiments of the present inventive concept.
Figure 3:
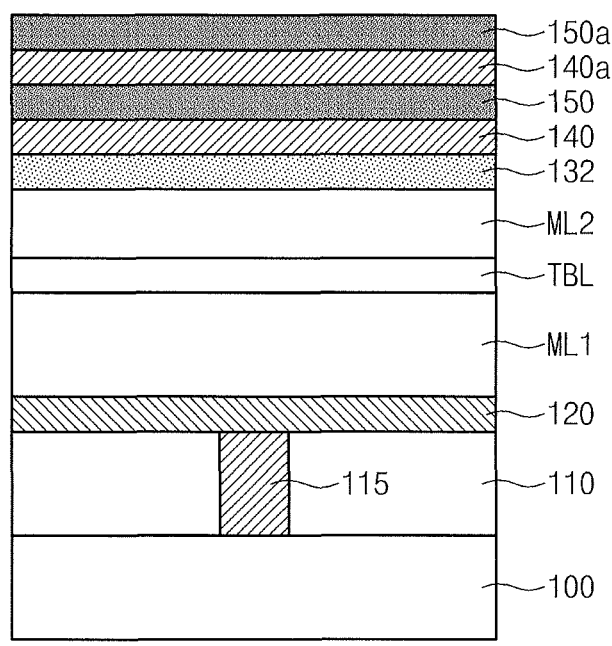
FIG. 3 is a cross-sectional view illustrating a method for manufacturing a magnetic memory device according to exemplary embodiments of the present inventive concept.

Referring to FIGS. 1 and 2A, a substrate 100 may be provided. The substrate 100 may be a silicon substrate, a germanium substrate, or a silicon-germanium substrate. A select element (not shown) may be formed on the substrate 100. The select element may be, for example, a field effect transistor or a diode.

A first interlayer dielectric layer 110 may be formed on the substrate 100. The first interlayer dielectric layer 110 may be formed to cover the select element. The first interlayer dielectric layer 110 may include at least one of, for example, a silicon oxide layer, a silicon nitride layer, and a silicon oxynitride layer. The first interlayer dielectric layer 110 may be formed using at least one of, for example, a physical vapor deposition (PVD) process, a chemical vapor deposition (CVD) process, and an atomic layer deposition (ALD) process.

A lower contact plug 115 may be formed to penetrate the first interlayer dielectric layer 110. The lower contact plug 115 may be electrically coupled to one terminal of the select element. The formation of the lower contact plug 115 may include, for example, forming a through hole penetrating the first interlayer dielectric layer 110, forming a conductive layer (not shown) to fill the through hole, and performing a planarization process until exposing a top surface of the first interlayer dielectric layer 110. The lower contact plugs 115 may include at least one of doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), and metal-semiconductor compound (e.g., metal silicide).

A bottom electrode layer 120 may be formed on the first interlayer dielectric layer 110. The bottom electrode layer 120 may be electrically coupled to the one terminal of the select element through the lower contact plug 115. The bottom electrode layer 120 may be formed using at least one of, for example, a physical vapor deposition (PVD) process, a chemical vapor deposition (CVD) process, and an atomic layer deposition (ALD) process.

The bottom electrode layer 120 may include at least one of metal and conductive metal nitride. In some embodiments, the bottom electrode layer 120 may serve as a seed layer in a subsequent process for fainting a first magnetic layer ML1 which will be discussed later. For example, in case that a first magnetic layer ML1 is formed of a magnetic material having an L10 structure, the bottom electrode layer 120 may be formed of conductive metal nitride having a sodium chloride (NaCl) crystal structure (e.g., titanium nitride, tantalum nitride, chromium nitride, or vanadium nitride). Alternatively, in case that a first magnetic layer ML1 has a hexagonal close packed crystal structure, the bottom electrode layer 120 may be formed of a conductive material having a hexagonal close packed crystal structure (e.g., ruthenium). However, the present inventive concept is not limited thereto. The bottom electrode layer 120 may be formed of other conductive material (e.g., titanium or tantalum).

A first magnetic layer ML1, a tunnel barrier layer TBL, and a second magnetic layer ML2 may be sequentially formed on the bottom electrode layer 120 (S100). Each of the first magnetic layer ML1, the tunnel barrier layer TBL, and the second magnetic layer ML2 may be formed using at least one of, for example, a physical vapor deposition (PVD) process, a chemical vapor deposition (CVD) process, and an atomic layer deposition (ALD) process.

The first magnetic layer ML1, the tunnel barrier layer TBL, and the second magnetic layer ML2 may constitute a magnetic tunnel junction MTJ. In some embodiments, the first magnetic layer ML1 may be a reference layer whose magnetization is fixed when a program operation is executed on the magnetic tunnel junction MTJ, and the second magnetic layer ML2 may be a free layer whose magnetization is changeable when the program operation is executed on the magnetic tunnel junction MTJ. Alternatively, the first magnetic layer ML1 may be a free layer and the second magnetic layer ML2 may be a reference layer. For brevity of the description, the following embodiments are explained in an exemplary case that the first magnetic layer ML1 is a reference layer and the second magnetic layer ML2 is a free layer.

The first magnetic layer ML1 may be a reference layer. The first magnetic layer ML1 may include at least one of a perpendicular magnetic material, a perpendicular magnetic material having an L10 structure, a CoPt alloy of a hexagonal close packed lattice structure, and a perpendicular magnetic structure. The perpendicular magnetic material may include at least one of CoFeTb, CoFeGd, and CoFeDy. The perpendicular magnetic material having the L10 structure may include at least one of FePt of the L10 structure, FePd of the L10 structure, CoPd of the L10 structure, and CoPt of the L10 structure. The perpendicular magnetic structure may include magnetic layers and non-magnetic layers that are alternately and repeatedly stacked. For example, the perpendicular magnetic structure may include at least one of a (Co/Pt)n stack structure, a (CoFe/Pt)n stack structure, a (CoFe/Pd)n stack structure, a (Co/Pd)n stack structure, a (Co/Ni)n stack structure, a (CoNi/Pt)n stack structure, a (CoCr/Pt)n stack structure, and a (CoCr/Pd)n stack structure (where, n is the natural number).

The tunnel barrier layer TBL may include at least one of magnesium oxide, titanium oxide, aluminum oxide, magnesium-zinc oxide, and magnesium-boron oxide. In some embodiments, the tunnel barrier layer TBL may include magnesium oxide having a sodium chloride (NaCl) crystal structure.

The second magnetic layer ML2 may be a free layer. The second magnetic layer ML2 may include a magnetic element (e.g., iron) that can combine with oxygen to induce an interface perpendicular magnetic anisotropy (I-PMA). In addition, the second magnetic layer ML2 may further include boron. For example, the second magnetic layer ML2 may be formed of cobalt-iron-boron (CoFeB). In some embodiments, the second magnetic layer ML2 may be in an amorphous state. For example, in case that the second magnetic layer ML1 is formed of CoFeB, the second magnetic layer ML2 may have a boron concentration of more than about 10 atomic percent (at %). CoFeB having a boron concentration of more than about 10 at % may be in an amorphous state.

A boron absorption layer 130 may be formed on the second magnetic layer ML2 (S110). In some embodiments, the boron absorption layer 130 may be formed to contact a top surface of the second magnetic layer ML2. The boron absorption layer 130 may be formed using at least one of, for example, a physical vapor deposition (PVD) process, a chemical vapor deposition (CVD) process, and an atomic layer deposition (ALD) process. The boron absorption layer 130 may have a greater boron diffusivity than the second magnetic layer ML2. For example, the second magnetic layer ML2 may include at least one of titanium (Ti), hafnium (Hf), zirconium (Zr), and tantalum (Ta). In some embodiments, the boron absorption layer 130 may have a thickness in the range from about 0.5 Å to about 10 Å.

Figure 2B:
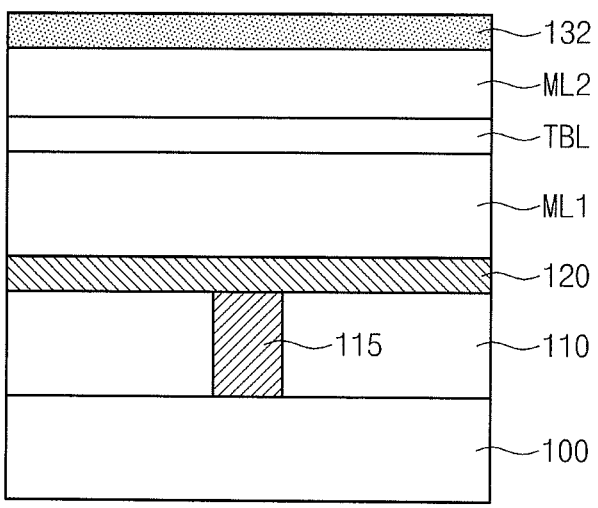

Referring to FIGS. 1 and 2B, a first heat treatment process may be carried out (S120). The first heat treatment process may be carried out using, for example, an annealing process using a furnace, a rapid thermal annealing process, or a laser annealing process. However, the present inventive concept is not limited thereto.

At least a portion of boron atoms contained in the second magnetic layer ML2 may diffuse into the boron absorption layer 130 as a result of the first heat treatment process to form a boron absorption layer 132. After the first heat treatment process is carried out, the boron absorption layer 132 formed may contain at least one metal boride. For example, the boron absorption layer 132 may contain at least one of titanium boride, hafnium boride, zirconium boride, and tantalum boride.

Since at least a portion of boron atoms are excluded from the second magnetic layer ML2 by the first heat treatment process, the second magnetic layer ML2 may have a decreased boron concentration. At least a portion of the second magnetic layer ML2 may have a boron concentration of less than about 10 at %, so that the at least a portion of the second magnetic layer ML2 may become a crystalline state. For example, the at least a portion of the second magnetic layer ML2 may have a body centered cubic crystal structure.

As discussed above, before the first heat treatment process, the boron absorption layer 130 may have a greater boron diffusivity than the second magnetic layer ML2. Thus, during the first heat treatment process, the boron atoms contained in the second magnetic layer ML2 may more readily diffuse into the boron absorption layer 130.

Figure 2C:
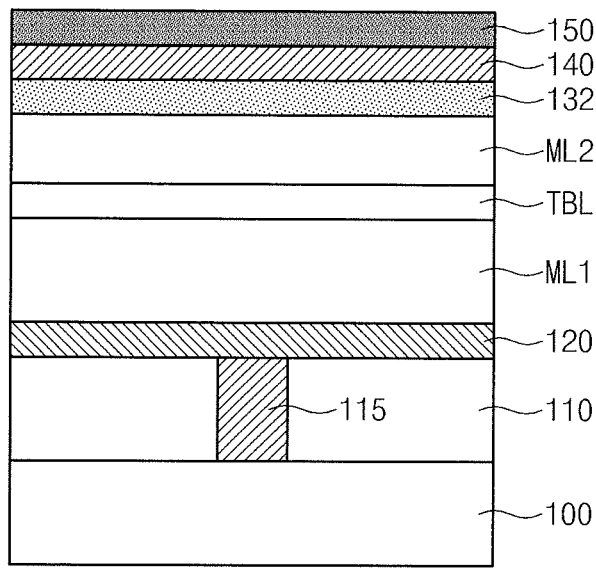

Referring to FIGS. 1 and 2C, a metal capping layer 140 and an oxygen donor layer 150 may be sequentially formed on the boron absorption layer 132 (S130). In some embodiments, the metal capping layer 140 may be formed to contact a top surface of the boron absorption layer 132, and the oxygen donor layer 150 may be formed to contact a top surface of the metal capping layer 140.

The metal capping layer 140 may be formed using at least one of, for example, a physical vapor deposition (PVD) process, a chemical vapor deposition (CVD) process, and an atomic layer deposition (ALD) process. The metal capping layer 140 may have a greater oxygen diffusivity than the oxygen donor layer 150 which will be discussed below. For example, the metal capping layer 140 may contain at least one of magnesium (Mg), aluminum (Al), scandium (Sc), titanium (Ti), vanadium (V), chromium (Cr), manganese (Mn), niobium (Nb), tungsten (W), and tantalum (Ta). In some embodiments, the metal capping layer 140 may have a thickness in the range from about 0.5 Å to about 10 Å.

The oxygen donor layer 150 may contain at least one metal oxide and have lower oxygen diffusivity than the metal capping layer 140. In some embodiments, the oxygen donor layer 150 may have a thickness in the range from about 0.5 Å to about 10 Å.

In some embodiments, the oxygen donor layer 150 may be formed by directly depositing metal oxide using a radio frequency sputtering (RF sputtering) process. In some embodiments, the oxygen donor layer 150 may include at least one of magnesium oxide (MgOx), aluminum oxide (AlOx), titanium oxide (TiOx), vanadium oxide (VOx), tungsten oxide (WOx), tantalum oxide (TaOx), hafnium oxide (HfOx), zirconium oxide (ZrOx), platinum oxide (PtOx), iridium oxide (IrOx), ruthenium oxide (RuOx), lead oxide (PbOx), palladium oxide (PdOx), osmium oxide (OsOx), rhodium oxide (RhOx), and rhenium oxide (ReOx).

In other embodiments, the oxygen donor layer 150 may be formed by forming a metal layer (not shown) on the metal capping layer 140 and then performing an oxidation process on the metal layer. The oxidation process may be performed using, for example, a natural oxidation process, a reactive oxidation process, or an oxygen ($O_2$) ion beam process. The metal layer may include at least one of platinum (Pt), iridium (Ir), ruthenium (Ru), lead (Pb), palladium (Pd), osmium (Os), rhodium (Rh), and rhenium (Re). Therefore, in some embodiments, the oxygen donor layer 150 may include at least one of platinum oxide (PtOx), iridium oxide (IrOx), ruthenium oxide (RuOx), lead oxide (PbOx), palladium oxide (PdOx), osmium oxide (OsOx), rhodium oxide (RhOx), and rhenium oxide (ReOx).

Figure 2D:
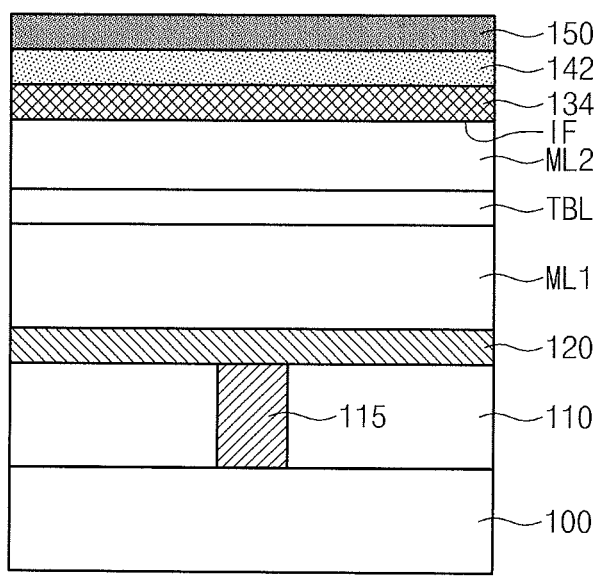

Referring to FIGS. 1 and 2D, a second heat treatment process may be carried out (S140). The second heat treatment process may be carried out at a temperature in the range of about 350° C. to about 450° C. The second heat treatment process may be carried out using, for example, an annealing process using a furnace, a rapid thermal annealing process, or a laser annealing process. However, the present inventive concept is not limited thereto.

At least a portion of oxygen atoms contained in the oxygen donor layer 150 may diffuse into the metal capping layer 140 as a result of the second heat treatment process to form a metal capping layer 142. After the second heat treatment process is carried out, the metal capping layer 142 formed may include at least one metal oxide. For example, the metal capping layer 142 may contain at least one of magnesium oxide (MgOx), aluminum oxide (AlOx), scandium oxide (ScOx), titanium oxide (TiOx), vanadium oxide (VOx), chromium oxide (CrOx), manganese oxide (MnOx), niobium oxide (NbOx), tungsten oxide (WOx), and tantalum oxide (TaOx). The metal oxide contained in the metal capping layer 142 may have a non-stoichiometric composition ratio. In detail, the metal oxide included in the metal capping layer 142 may have an oxygen concentration less than that of metal oxide having a stoichiometric composition ratio.

At least a portion of oxygen atoms contained in the oxygen donor layer 150 may diffuse into the boron absorption layer 132 after passing through the metal capping layer 142 as a result of the second heat treatment process to form a boron absorption layer 134. After the second heat treatment process is carried out, the boron absorption layer 134 formed may contain at least one metal boron oxide. For example, the boron absorption layer 134 may contain at least one of titanium boron oxide, hafnium boron oxide, zirconium boron oxide, and tantalum boron oxide. The metal boron oxide contained in the boron absorption layer 134 may have a non-stoichiometric composition ratio. In detail, the metal boron oxide included in the boron absorption layer 134 may have an oxygen concentration less than that of metal boron oxide having a stoichiometric composition ratio.

At least a portion of oxygen atoms contained in the oxygen donor layer 150 may diffuse into an interface IF between the second magnetic layer ML2 and the boron absorption layer 134 after passing through the metal capping layer 142 and the boron absorption layer 134 as a result of the second heat treatment process. The oxygen atoms diffused into the interface IF between the second magnetic layer ML2 and the boron absorption layer 134 may induce an interface perpendicular magnetization anisotropy by combining with magnetic elements (e.g., iron atoms) included in the second magnetic layer ML2.

According to exemplary embodiments of the present inventive concept, the oxygen donor layer 150 may be formed on the metal capping layer 140. The formation of the oxygen donor layer 150 on the metal capping layer 140 can prevent the boron absorption layer 132 and the second magnetic layer ML2 from being excessively oxidized. In other words, according to exemplary embodiments of the present inventive concept, the formation of the oxygen donor layer 150 on the metal capping layer 140 can suppress damages to the boron absorption layer 132 and/or the second magnetic layer ML2.

Furthermore, according to exemplary embodiments of the present inventive concept, the metal capping layer 140 and the oxygen donor layer 150 may be formed as a thin layer of about 0.5 Å to about 10 Å. Therefore, a metal capping pattern 142p and an oxygen donor pattern 150p may contribute to the reduction of the increase of electrical resistance between an upper contact plug 175 and the lower contact plug 115, which will be discussed below.

As discussed above, at least a portion of oxygen atoms contained in the oxygen donor layer 150, may diffuse into the interface IF between the second magnetic layer ML2 and the boron absorption layer 134 after passing through the metal capping layer 140 as a result of the second heat treatment process. According to exemplary embodiments of the present inventive concept, the metal capping layer 140 may have a greater oxygen diffusivity than the oxygen donor layer 150. Thus, during the second heat treatment process, the oxygen atoms contained in the oxygen donor layer 150 may more readily diffuse into the interface IF between the second magnetic layer ML2 and the boron absorption layer 134.

Figure 2E:
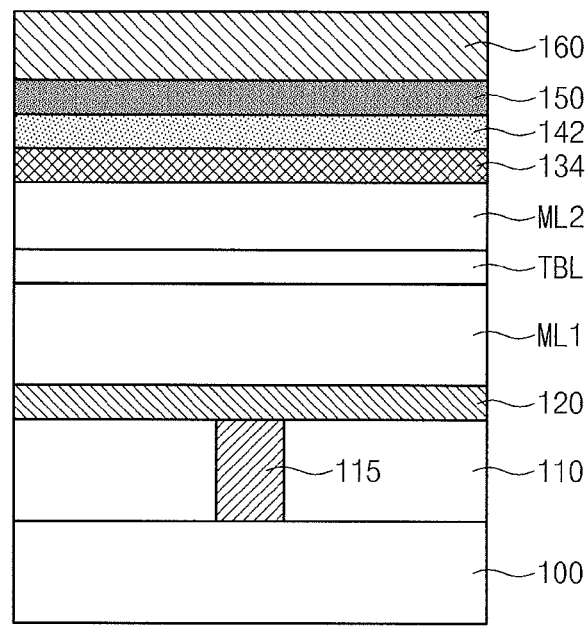

Referring to FIG. 2E, a top electrode layer 160 may be formed on the oxygen donor layer 150. The top electrode layer 160 may include at least one of metal (e.g., tungsten, aluminum, copper, titanium, ruthenium, and/or tantalum) and conductive metal nitride (e.g., titanium nitride, tantalum nitride, and/or tungsten nitride). The top electrode layer 160 may be formed using at least one of, for example, a physical vapor deposition (PVD) process, a chemical vapor deposition (CVD) process, and an atomic layer deposition (ALD) process. Although presented with respect to forming the top electrode layer 160 on the oxygen donor layer 150 after performing the second heat treatment process, in some embodiments, the second heat treatment process may be performed after the top electrode layer 160 is formed on the oxygen donor layer 150. In other embodiments, after the second heat treatment process, the top electrode layer 160 may be formed on the boron absorption layer 134, after removing the oxygen donor layer 150 and the metal capping layer 142. In yet other embodiments, after the second heat treatment process, the top electrode layer 160 may be formed on the metal capping layer 142, after removing the oxygen donor layer 150.

Figure 2F:
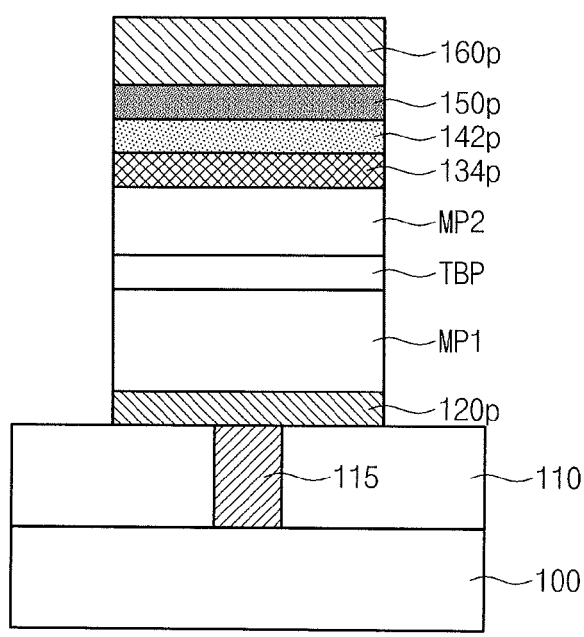

Referring to FIG. 2F, the top electrode layer 160, the oxygen donor layer 150, the metal capping layer 142, the boron absorption layer 134, the second magnetic layer ML2, the tunnel barrier layer TBL, the first magnetic layer ML1, and the bottom electrode layer 120 may be successively patterned to form a bottom electrode pattern 120p, a first magnetic pattern MP1, a tunnel barrier pattern TBP, a second magnetic pattern MP2, a boron absorption pattern 134p, a metal capping pattern 142p, an oxygen donor pattern 150p, and a top electrode pattern 160p that are sequentially stacked. For example, an ion beam etch process may be used to pattern the layers 160, 150, 152, 134, ML2, TBL, ML1 and 120.

Figure 2G:
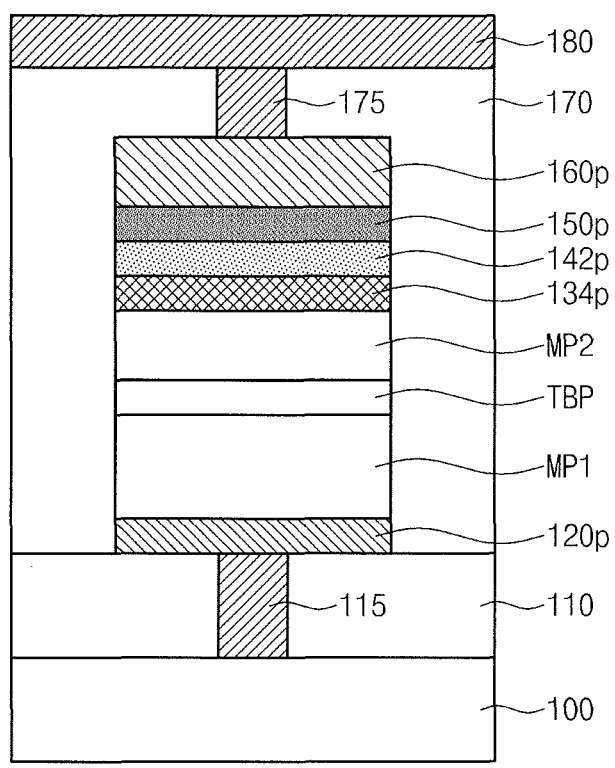

Referring to FIG. 2G, a second interlayer dielectric layer 170 may be formed to cover the patterns 120p, MP1, TBP, MP2, 134p, 142p, 150p and 160p. The second interlayer dielectric layer 170 may include at least one of, for example, a silicon oxide layer, a silicon nitride layer, and a silicon oxynitride layer. The second interlayer dielectric layer 170 may be formed using at least one of, for example, a physical vapor deposition (PVD) process, a chemical vapor deposition (CVD) process, and an atomic layer deposition (ALD) process.

An upper contact plug 175 may be formed in the second interlayer dielectric layer 170. The formation of the upper contact plug 175 may include, for example, forming a through hole exposing the top electrode pattern 160p in the second interlayer dielectric layer 170, forming a conductive layer (not shown) to fill the through hole, and performing a planarization process until exposing a top surface of the second interlayer dielectric layer 170. The upper contact plug 175 may be electrically connected to the top electrode pattern 160p. An interconnect line 180 may be formed on the second interlayer dielectric layer 170. The interconnect line 180 may be electrically connected to the upper contact plug 175. Each of the upper contact plug 175 and the interconnect line 180 may include at least one of doped semiconductor material (e.g., doped silicon), metal (e.g., tungsten, aluminum, copper, titanium, and/or tantalum), conductive metal nitride (e.g., titanium nitride, tantalum nitride, and/or tungsten nitride), and metal-semiconductor compound (e.g., metal silicide).

In other embodiments of the inventive concept, as shown in FIG. 3, at least one additional metal capping layer 140a and at least one additional oxygen donor layer 150a may be further formed sequentially and alternately on the oxygen donor layer 150, before performing the second heat treatment process. The additional metal capping layer 140a and the additional oxygen donor layer 150a may be substantially the same as the metal capping layer 140 and the oxygen donor layer 150, discussed with reference to FIG. 2C, respectively.

Figure 4A:
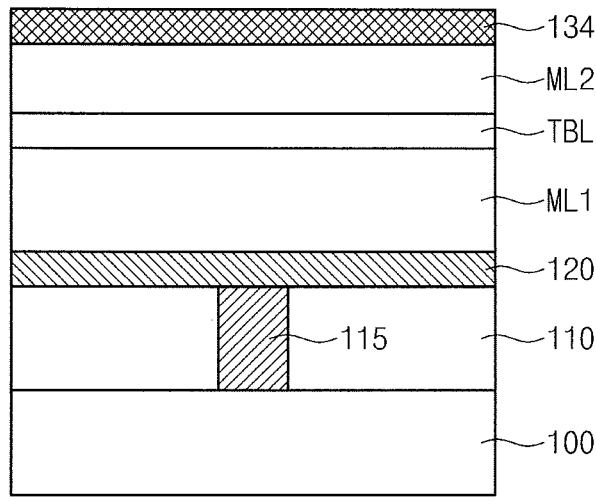
FIGS. 4A and 4B are cross-sectional views illustrating a method for manufacturing a magnetic memory device according to exemplary embodiments of the present inventive concept.
Figure 4B:
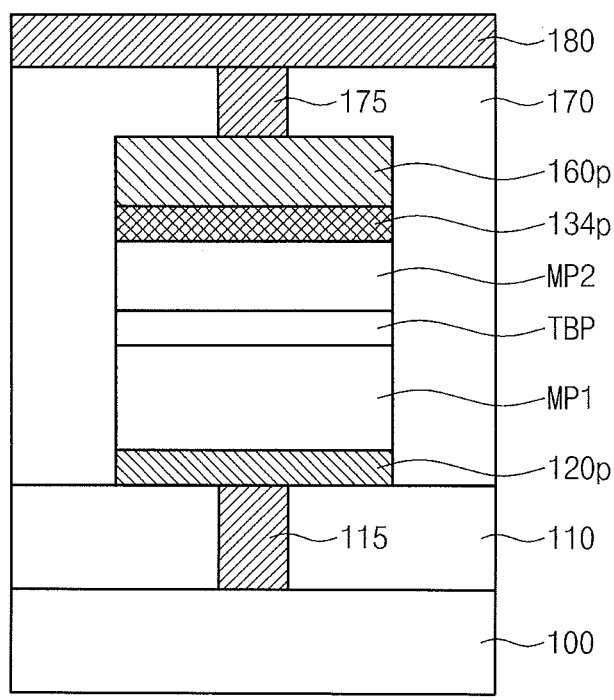

FIGS. 4A and 4B are cross-sectional views illustrating a method for manufacturing a magnetic memory device according to exemplary embodiments of the present inventive concept. Specifically, FIGS. 4A and 4B show subsequent processes after the second heat treatment process discussed with reference to FIGS. 1 and 2D.

Referring to FIG. 4A, the oxygen donor layer 150 and the metal capping layer 142 may be removed. For example, an ion beam etch process or a plasma etch process may be performed to remove the oxygen donor layer 150 and the metal capping layer 142.

Referring to FIG. 4B, after forming a top electrode layer on the boron absorption layer 134, the top electrode layer, the boron absorption layer 134, the second magnetic layer ML2, the tunnel barrier layer TBL, the first magnetic layer ML1, and the bottom electrode layer 120 may be successively patterned to form a bottom electrode pattern 120p, a first magnetic pattern MP1, a tunnel barrier pattern TBP, a second magnetic pattern MP2, a boron absorption pattern 134p, and a top electrode pattern 160p that are sequentially stacked.

Thereafter, a second interlayer dielectric layer 170, an upper contact plug 175, and an interconnect line 180 may be sequentially formed. Those discussed with reference to FIG. 2G may be substantially identically used to form the second interlayer dielectric layer 170, the upper contact plug 175, and the interconnect line 180.

According to exemplary embodiments of the present inventive concept, the oxygen donor layer 150 and the metal capping layer 142 may be removed after the second heat treatment process is performed. It thus may be possible to reduce an electrical resistance between the upper contact plug 175 and the lower contact plug 115.

Figure 5A:
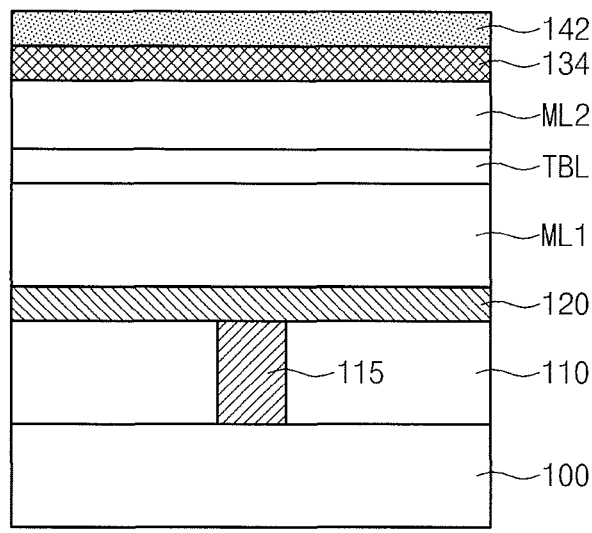
FIGS. 5A and 5B are cross-sectional views illustrating a method for manufacturing a magnetic memory device according to exemplary embodiments of the present inventive concept.
Figure 5B:
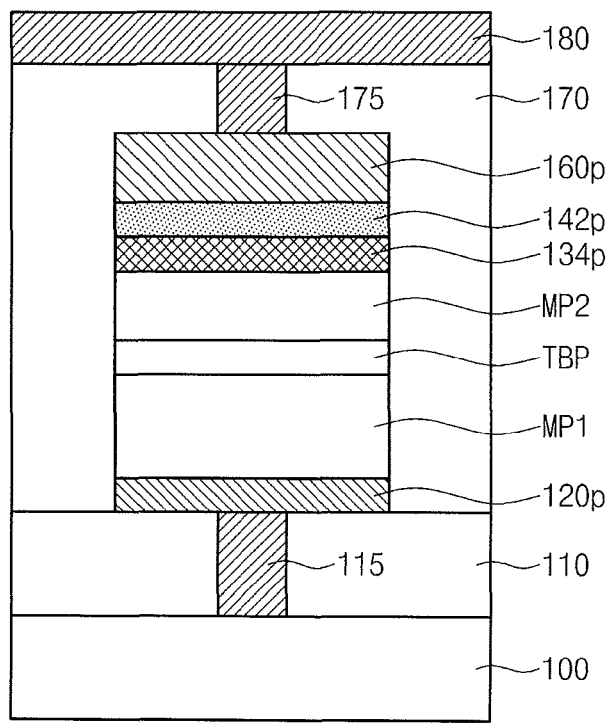

FIGS. 5A and 5B are cross-sectional views illustrating a method for manufacturing a magnetic memory device according to exemplary embodiments of the present inventive concept. Specifically, FIGS. 5A and 5B show subsequent processes after the second heat treatment process discussed with reference to FIGS. 1 and 2D.

Referring to FIG. 5A, the oxygen donor layer 150 may be removed. The removal of the oxygen donor layer 150 may be performed using, for example, an ion beam etch process or a plasma etch process.

Referring to FIG. 5B, after forming a top electrode layer on the metal capping layer 142, the top electrode layer, the metal capping layer 142, the boron absorption layer 134, the second magnetic layer ML2, the tunnel barrier layer TBL, the first magnetic layer ML1, and the bottom electrode layer 120 may be successively patterned to form a bottom electrode pattern 120p, a first magnetic pattern MP1, a tunnel barrier pattern TBP, a second magnetic pattern MP2, a boron absorption pattern 134p, a metal capping pattern 142a, and a top electrode pattern 160p that are sequentially stacked.

Thereafter, a second interlayer dielectric layer 170, an upper contact plug 175, and an interconnect line 180 may be sequentially formed. Those discussed with reference to FIG. 2G may be substantially identically used to form the second interlayer dielectric layer 170, the upper contact plug 175, and the interconnect line 180.

According to exemplary embodiments of the present inventive concept, the oxygen donor layer 150 may be removed after the second heat treatment process is performed. It thus may be possible to reduce an electrical resistance between the upper contact plug 175 and the lower contact plug 115.

Figure 6:
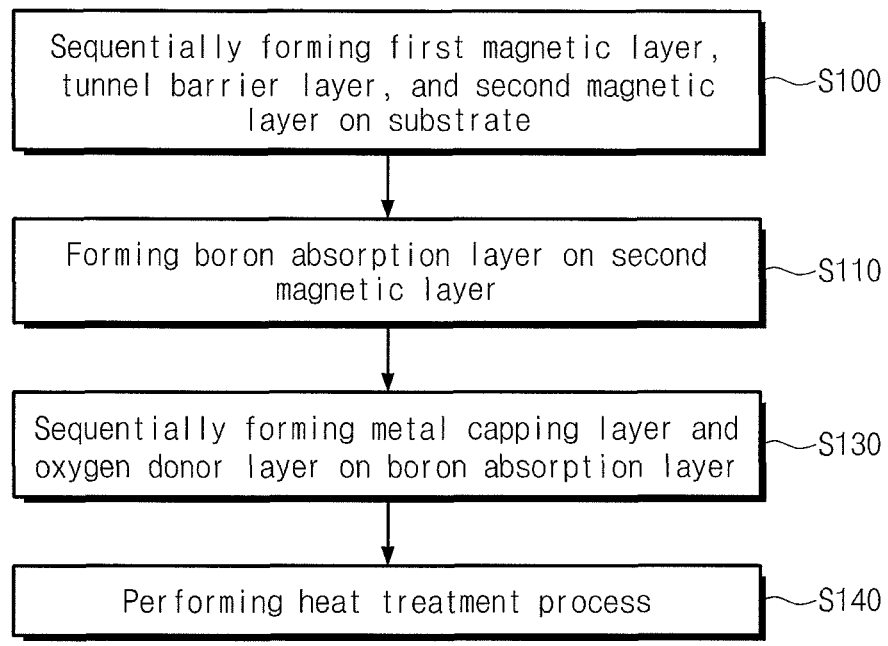
FIG. 6 is a flow chart illustrating a method for manufacturing a magnetic memory device according to exemplary embodiments of the present inventive concept.
Figure 7:
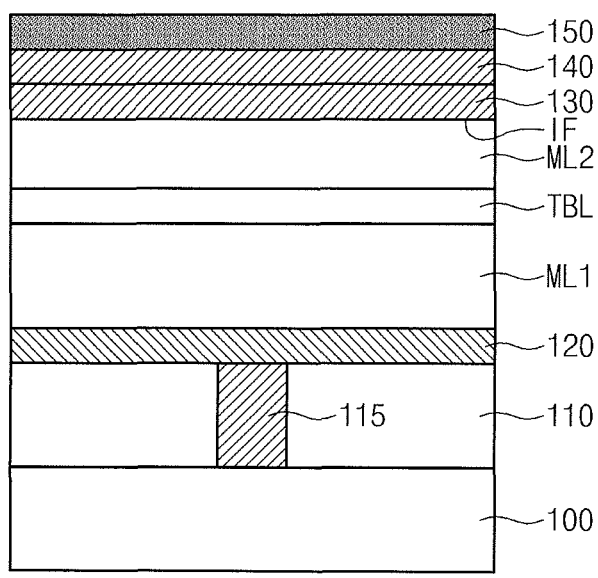
FIG. 7 is a cross-sectional view illustrating a method for manufacturing a magnetic memory device according to exemplary embodiments of the present inventive concept.

FIG. 6 is a flow chart illustrating a method for manufacturing a magnetic memory device according to exemplary embodiments of the present inventive concept. FIG. 7 is a cross-sectional view illustrating a method for manufacturing a magnetic memory device according to exemplary embodiments of the present inventive concept.

Referring to FIGS. 6 and 7, a first interlayer dielectric layer 110 and a lower contact plug 115 may be formed on a substrate 100. Thereafter, a bottom electrode layer 120, a first magnetic layer ML1, a tunnel barrier layer TBL, a second magnetic layer ML2, and a boron absorption layer 130 may be sequentially formed on the first interlayer dielectric layer 110 (S100 and S110). Those discussed with reference to FIGS. 1 and 2A may be substantially identically used to form the first interlayer dielectric layer 110, the lower contact plug 115, the bottom electrode layer 120, the first magnetic layer ML1, the tunnel barrier layer TBL, the second magnetic layer ML2, and the boron absorption layer 130.

A metal capping layer 140 and an oxygen donor layer 150 may be sequentially formed on the boron absorption layer 130 (S130). The formations of the metal capping layer 140 and the oxygen donor layer 150 may be substantially the same as those discussed with reference to FIGS. 1 and 2C except that a separate heat treatment process is not performed before the formation of the metal capping layer 140.

Referring to FIGS. 6 and 2D, a heat treatment process may be carried out (S140). The heat treatment process may be similar to the second heat treatment process discussed with reference to FIGS. 1 and 2D.

In detail, at least a portion of oxygen atoms, included in the oxygen donor layer 150, may diffuse into the metal capping layer 140 to form a metal capping layer 142 as a result of the heat treatment process. Accordingly, metal oxide may be contained in a metal capping layer 142 that has experienced the heat treatment process. For example, the metal capping layer 142 that has experienced the heat treatment process may contain at least one of magnesium oxide (MgOx), aluminum oxide (AlOx), scandium oxide (ScOx), titanium oxide (TiOx), vanadium oxide (VOx), chromium oxide (CrOx), manganese oxide (MnOx), niobium oxide (NbOx), tungsten oxide (WOx), and tantalum oxide (TaOx). The metal oxide included in the metal capping layer 142 may have a non-stoichiometric composition ratio. In detail, the metal oxide included in the metal capping layer 142 may have an oxygen concentration less than that of metal oxide having a stoichiometric composition ratio.

At least a portion of oxygen atoms contained in the oxygen donor layer 150, may diffuse into the boron absorption layer 130 after passing through the metal capping layer 142 as a result of the heat treatment process. In addition, at least a portion of boron atoms, included in the second magnetic layer ML2, may diffuse into the boron absorption layer 130, to form a boron absorption layer 134. Accordingly, metal boron oxide may be contained in a boron absorption layer 134 that has experienced heat treatment process. For example, the boron absorption layer 134 that has experienced the heat treatment process may include at least one of titanium boron oxide, hafnium boron oxide, zirconium boron oxide, and tantalum boron oxide. The metal boron oxide included in the boron absorption layer 134 may have a non-stoichiometric composition ratio. In detail, the metal boron oxide included in the boron absorption layer 134 may have an oxygen concentration less than that of metal boron oxide having a stoichiometric composition ratio.

Since at least a portion of boron atoms are excluded from the second magnetic layer ML2 by the heat treatment process, the second magnetic layer ML2 may have a decreased boron concentration. At least a portion of the second magnetic layer ML2 may have a boron concentration of less than about 10 at %, so that the at least a portion of the second magnetic layer ML2 may become a crystalline state.

At least a portion of oxygen atoms contained in the oxygen donor layer 150, may diffuse into an interface IF between the second magnetic layer ML2 and the boron absorption layer 134 after passing through the metal capping layer 142 and the boron absorption layer 134 as a result of the heat treatment process. The oxygen atoms diffused into the interface IF between the second magnetic layer ML2 and the boron absorption layer 134 may induce an interface perpendicular magnetization anisotropy by combining with magnetic elements (e.g., iron atoms) included in the second magnetic layer ML2.

Subsequent processes after the heat treatment process may be substantially the same as the processes discussed with reference to FIGS. 2F and 2G, FIGS. 4A and 4B, or FIGS. 5A and 5B.

Figure 8:
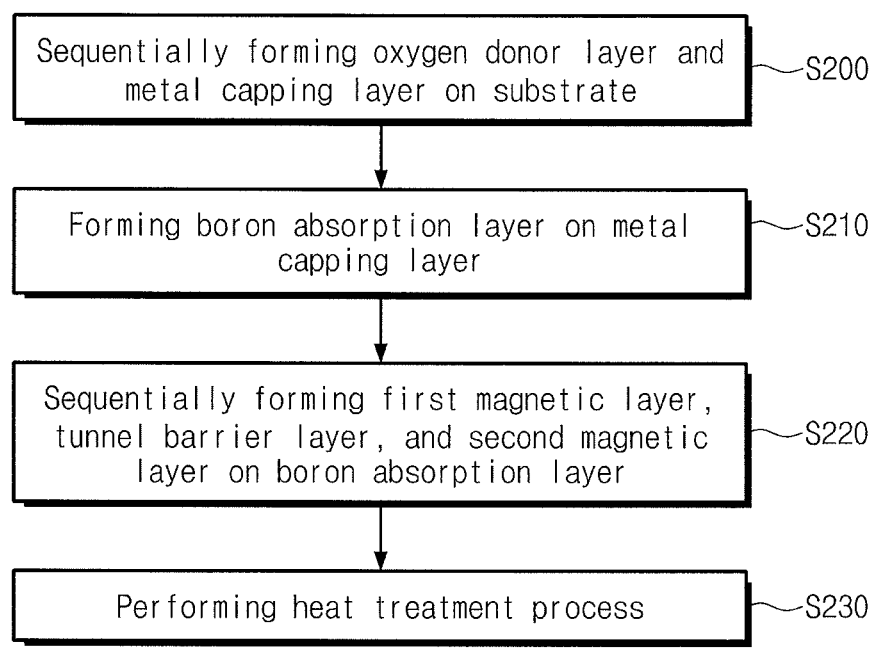
FIG. 8 is a flow chart illustrating a method for manufacturing a magnetic memory device according to exemplary embodiments of the present inventive concept.

FIG. 8 is a flow chart illustrating a method for manufacturing a magnetic memory device according to exemplary embodiments of the present inventive concept. FIGS. 9A to 9E are cross-sectional views illustrating a method for manufacturing a magnetic memory device according to exemplary embodiments of the present inventive concept.

Figure 9A:
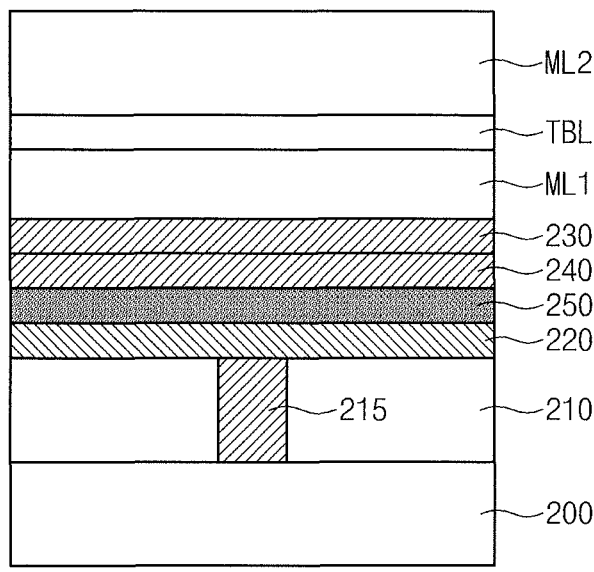
FIGS. 9A to 9E are cross-sectional views illustrating a method for manufacturing a magnetic memory device according to exemplary embodiments of the present inventive concept.

Referring to FIGS. 8 and 9A, a substrate 200 may be provided. A select element (not shown) may be formed on the substrate 200.

A first interlayer dielectric layer 210 and a lower contact plug 215 may be formed on the substrate 200. The formations of the first interlayer dielectric layer 210 and the lower contact plug 215 may be substantially the same as the formations of the first interlayer dielectric layer 110 and the lower contact plug 115 discussed with reference to FIGS. 1 and 2A.

A bottom electrode layer 220 may be formed on the first interlayer dielectric layer 210. The bottom electrode layer 220 may be electrically coupled to one terminal of the select element through the lower contact plug 215. The bottom electrode layer 220 may include, for example, conductive metal nitride. The bottom electrode layer 220 may be formed using at least one of, for example, a physical vapor deposition (PVD) process, a chemical vapor deposition (CVD) process, and an atomic layer deposition (ALD) process.

An oxygen donor layer 250 and a metal capping layer 240 may be sequentially formed on the bottom electrode layer 220 (S200). In some embodiments, the metal capping layer 240 may be formed to contact a top surface of the oxygen donor layer 250.

The oxygen donor layer 250 may include metal oxide and have a lower oxygen diffusivity than the metal capping layer 240 which will be formed in a subsequent process. In some embodiments, the oxygen donor layer 250 may have a thickness in the range from about 0.5 Å to about 10 Å. A detailed method for forming the oxygen donor layer 250 may be substantially the same as the method for forming the oxygen donor layer 150 discussed with reference to FIGS. 1 and 2C.

The metal capping layer 240 may have a greater oxygen diffusivity than the oxygen donor layer 250. For example, the metal capping layer 240 may include at least one of magnesium (Mg), aluminum (Al), scandium (Sc), titanium (Ti), vanadium (V), chromium (Cr), manganese (Mn), niobium (Nb), tungsten (W), and tantalum (Ta). In some embodiments, the metal capping layer 240 may have a thickness in the range from about 0.5 Å to about 10 Å.

A boron absorption layer 230 may be formed on the metal capping layer 240 (S210). In some embodiments, the boron absorption layer 230 may be formed to contact a top surface of the metal capping layer 240. The boron absorption layer 230 may have a greater boron diffusivity than a second magnetic layer ML2 which will be formed in a subsequent process. For example, the second magnetic layer ML2 may include at least one of titanium (Ti), hafnium (Hf), zirconium (Zr), and tantalum (Ta). In some embodiments, the boron absorption layer 230 may have a thickness in the range from about 0.5 Å to about 10 Å.

A first magnetic layer ML1, a tunnel barrier layer TBL, and a second magnetic layer ML2 may be sequentially formed on the boron absorption layer 230 (S220). Each of the first magnetic layer ML1, the tunnel barrier layer TBL, and the second magnetic layer ML2 may be formed using at least one of, for example, a physical vapor deposition (PVD) process, a chemical vapor deposition (CVD) process, and an atomic layer deposition (ALD) process. In some embodiments, the first magnetic layer ML1 may be formed to contact a top surface of the boron absorption layer 230.

The first magnetic layer ML1, the tunnel barrier layer TBL, and the second magnetic layer ML2 may constitute a magnetic tunnel junction MTJ. One of the first magnetic layer ML1 and the second magnetic layer ML2 may be a reference layer whose magnetization is fixed, and the other of the first magnetic layer ML1 and the second magnetic layer ML2 may be a free layer whose magnetization is changeable. For brevity of the description, the following embodiments are explained in an exemplary case that the first magnetic layer ML1 is a free layer and the second magnetic layer ML2 is a reference layer.

The first magnetic layer ML1 may be a free layer. The first magnetic layer ML1 may include a magnetic element (e.g., iron) that can combine with oxygen to induce an interface perpendicular magnetic anisotropy (I-PMA). In addition, the first magnetic layer ML1 may further include boron. For example, the first magnetic layer ML1 may be formed of cobalt-iron-boron (CoFeB). In some embodiments, the first magnetic layer ML1 may be in an amorphous state. For example, in case that the first magnetic layer ML1 is formed of CoFeB, the first magnetic layer ML1 may have a boron concentration of more than about 10 at %.

The tunnel barrier layer TBL may include at least one of magnesium oxide, titanium oxide, aluminum oxide, magnesium-zinc oxide, and magnesium-boron oxide.

The second magnetic layer ML2 may be a reference layer. The second magnetic layer ML2 may include at least one of a perpendicular magnetic material, a perpendicular magnetic material having an L10 structure, a CoPt alloy of a hexagonal close packed lattice structure, and a perpendicular magnetic structure.

Figure 9B:
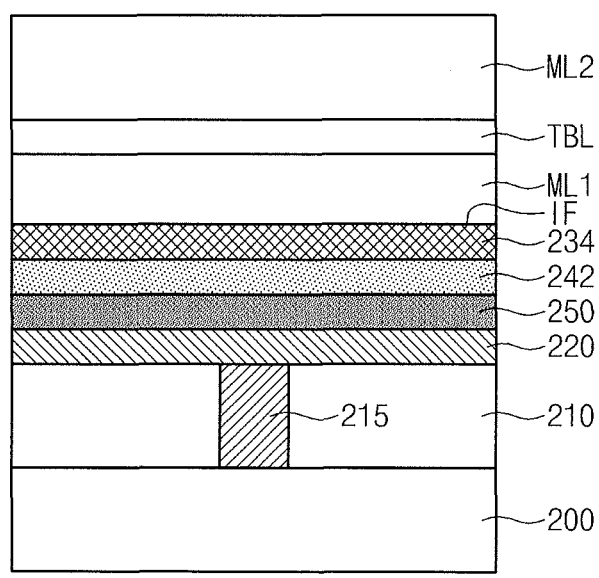

Referring to FIGS. 8 and 9B, a heat treatment process may be carried out (S230). The heat treatment process may be carried out at a temperature of about 350° C. to about 450° C. The heat treatment process may be carried out using, for example, an annealing process using a furnace, a rapid thermal annealing process, or a laser annealing process.

At least a portion of oxygen atoms, included in the oxygen donor layer 250, may diffuse into the metal capping layer 240 to form a metal capping layer 242 as a result of the heat treatment process. Accordingly, metal oxide may be included in a metal capping layer 242 that has experienced the heat treatment process. For example, the metal capping layer 242 that has experienced the heat treatment process may include at least one of magnesium oxide (MgOx), aluminum oxide (AlOx), scandium oxide (ScOx), titanium oxide (TiOx), vanadium oxide (VOx), chromium oxide (CrOx), manganese oxide (MnOx), niobium oxide (NbOx), tungsten oxide (WOx), and tantalum oxide (TaOx). The metal oxide included in the metal capping layer 242 may have a non-stoichiometric composition ratio. In detail, the metal oxide included in the metal capping layer 242 may have an oxygen concentration less than that of metal oxide having a stoichiometric composition ratio.

At least a portion of oxygen atoms, included in the oxygen donor layer 250, may diffuse into the boron absorption layer 230 after passing through the metal capping layer 242 as a result of the heat treatment process. In addition, at least a portion of boron atoms, included in the first magnetic layer ML1, may diffuse into the boron absorption layer 230 to form a boron absorption layer 234. Accordingly, metal boron oxide may be included in a boron absorption layer 234 that has experienced heat treatment process. For example, the boron absorption layer 234 that has experienced the heat treatment process may include at least one of titanium boron oxide, hafnium boron oxide, zirconium boron oxide, and tantalum boron oxide. The metal boron oxide included in the boron absorption layer 234 may have a non-stoichiometric composition ratio. In detail, the metal boron oxide included in the boron absorption layer 234 may have an oxygen concentration less than that of metal boron oxide having a stoichiometric composition ratio.

Since at least a portion of boron atoms are excluded from the first magnetic layer ML1 by the heat treatment process, the first magnetic layer ML1 may have a decreased boron concentration. At least a portion of the first magnetic layer ML1 may have a boron concentration of less than about 10 at %, so that the at least a portion of the first magnetic layer ML1 may become a crystalline state.

At least a portion of oxygen atoms, included in the oxygen donor layer 250, may diffuse into an interface IF between the first magnetic layer ML1 and the boron absorption layer 234 after passing through the metal capping layer 242 and the boron absorption layer 234 as a result of the heat treatment process. The oxygen atoms diffused into the interface IF between the first magnetic layer ML1 and the boron absorption layer 134 may induce an interface perpendicular magnetization anisotropy by combining with magnetic elements (e.g., iron atoms) included in the first magnetic layer ML1.

Figure 9C:
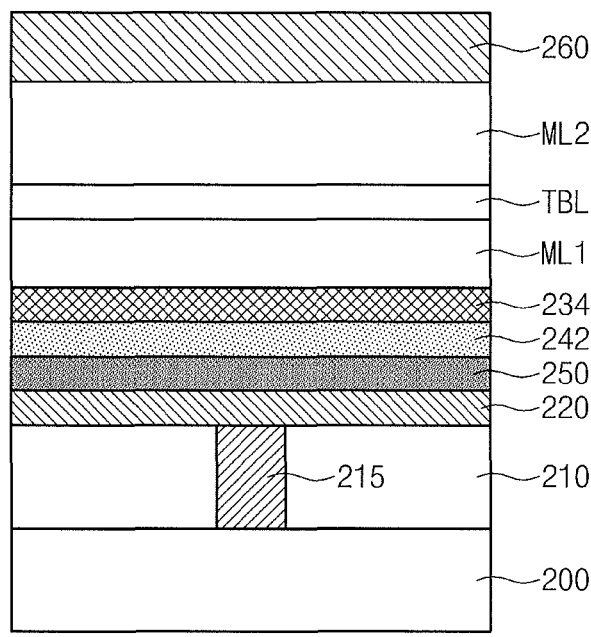

Referring to FIG. 9C, a top electrode layer 260 may be formed on the second magnetic layer ML2. The top electrode layer 260 may include at least one of metal and conductive metal nitride. The top electrode layer 260 may be formed using at least one of, for example, a physical vapor deposition (PVD) process, a chemical vapor deposition (CVD) process, and an atomic layer deposition (ALD) process. In some embodiments, the heat treatment process may be performed after the top electrode layer 260 is formed.

Figure 9D:
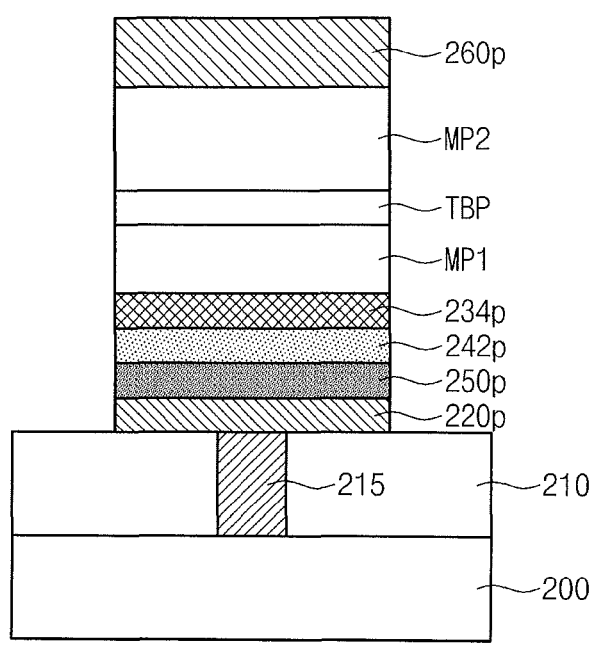
Figure 9E:
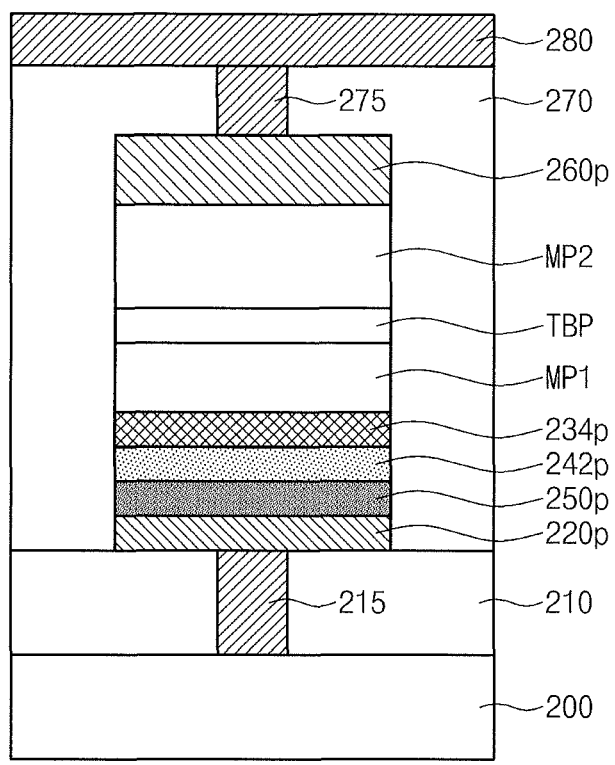

Referring to FIG. 9D, the top electrode layer 260, the second magnetic layer ML2, the tunnel barrier layer TBL, the first magnetic layer ML1, the boron absorption layer 234, the metal capping layer 242, the oxygen donor layer 250, and the bottom electrode layer 220 may be successively patterned to form a bottom electrode pattern 220p, an oxygen donor pattern 250p, a metal capping pattern 242p, a boron absorption pattern 234p, a first magnetic pattern MP1, a tunnel barrier pattern TBP, a second magnetic pattern MP2, and a top electrode pattern 260p that are sequentially stacked. For example, an ion beam etch process may be used to pattern the layers 260, ML2, TBL, ML1, 234, 242, 250 and 220.

Referring to FIG. 9G, a second interlayer dielectric layer 270 may be formed to cover the patterns 220p, 250p, 242p, 234p, MP1, TBP, MP2 and 260p. The second interlayer dielectric layer 270 may include at least one of, for example, a silicon oxide layer, a silicon nitride layer, and a silicon oxynitride layer.

An upper contact plug 275 may be formed in the second interlayer dielectric layer 270. The formation of the upper contact plug 275 may include, for example, forming a through hole exposing the top electrode pattern 260p in the second interlayer dielectric layer 270, forming a conductive layer (not shown) to fill the through hole, and performing a planarization process until exposing a top surface of the second interlayer dielectric layer 270. The upper contact plug 275 may be electrically connected to the top electrode pattern 260p. An interconnect line 280 may be formed on the second interlayer dielectric layer 270. The interconnect line 280 may be electrically connected to the upper contact plug 275. In some embodiments, the formation of the oxygen donor layer may suppress damages to the boron absorption layer and/or the second magnetic layer.

According to exemplary embodiments of the present inventive concept, the metal capping layer and the oxygen donor layer may be formed as a thin layer of about 0.5 Å to about 10 Å. Therefore, the metal capping pattern and the oxygen donor pattern may reduce the increase of an electrical resistance between the upper contact plug and the lower contact plug. Also, according to exemplary embodiments of the present inventive concept, the oxygen donor layer and/or the metal capping layer may be removed after the heat treatment process is performed. It thus may be possible to reduce an electrical resistance between the upper contact plug and the lower contact plug.

Although the present invention has been described in connection with the embodiments of the present inventive concept illustrated in the accompanying drawings, it is not limited thereto. It will be apparent to those skilled in the art that various substitution, modifications, and changes may be thereto without departing from the scope and spirit of the inventive concept.

What is claimed is:

1. A method for manufacturing a magnetic memory device, the method comprising:
   sequentially forming a first magnetic layer, a tunnel barrier layer, and a second magnetic layer on a substrate;
   forming a boron absorption layer on the second magnetic layer;
   sequentially forming a metal capping layer and an oxygen donor layer on the boron absorption layer, the metal capping layer having a greater oxygen diffusivity than the oxygen donor layer; and
   performing a heat treatment process to diffuse at least a portion of oxygen atoms contained in the oxygen donor layer into the metal capping layer and the boron absorption layer.

2. The method of claim 1, wherein at least a portion of boron atoms contained in the second magnetic layer diffuse into the boron absorption layer as a result of the heat treatment process.

3. The method of claim 1, further comprising an additional heat treatment process, wherein the additional heat treatment process is performed before forming the metal capping layer and the oxygen donor layer,
wherein at least a portion of boron atoms, contained in the second magnetic layer, diffuse into the boron absorption layer as a result of the additional heat treatment process.

4. The method of claim 1, wherein the metal capping layer comprises at least one of magnesium, aluminum, scandium, titanium, vanadium, chromium, manganese, niobium, tungsten, and tantalum.

5. The method of claim 1, wherein the oxygen donor layer is formed directly on the metal capping layer using a radio frequency (RF) sputtering process, and
wherein the oxygen donor layer comprises at least one of magnesium oxide, aluminum oxide, titanium oxide, vanadium oxide, tungsten oxide, tantalum oxide, hafnium oxide, zirconium oxide, platinum oxide, iridium oxide, ruthenium oxide, lead oxide, palladium oxide, osmium oxide, rhodium oxide, and rhenium oxide.

6. The method of claim 1, wherein forming the oxygen donor layer comprises:
forming a metal layer on the metal capping layer; and
oxidizing the metal layer,
wherein the metal layer comprises at least one of platinum, iridium, ruthenium, lead, palladium, osmium, rhodium, and rhenium.

7. The method of claim 1, wherein the boron absorption layer comprises at least one of titanium, hafnium, zirconium, and tantalum.

8. The method of claim 1, wherein the metal capping layer and the boron absorption layer are oxidized as a result the heat treatment process to provide an oxidized metal capping layer and an oxidized boron absorption layer,
wherein the oxidized metal capping layer comprises metal oxide having a non-stoichiometric composition ratio, and the oxidized boron absorption layer comprises metal boron oxide having a non-stoichiometric composition ratio.

9. The method of claim 1, wherein the metal capping layer and/or the oxygen donor layer has a thickness in a range from about 0.5 Å to about 10 Å.

10. The method of claim 1, further comprising removing the oxygen donor layer and the metal capping layer after performing the heat treatment process.

11. The method of claim 1, further comprising sequentially and alternately forming at least one additional metal capping layer and at least one additional oxygen donor layer on the oxygen donor layer, before performing the heat treatment process.

12. A method for manufacturing a magnetic memory device, the method comprising:
sequentially forming an oxygen donor layer and a metal capping layer on a substrate, the metal capping layer including a greater oxygen diffusivity than the oxygen donor layer;
forming a boron absorption layer on the metal capping layer;
sequentially forming a first magnetic layer, a tunnel barrier layer, and a second magnetic layer on the boron absorption layer; and
performing a heat treatment process to diffuse at least a portion of oxygen atoms contained in the oxygen donor layer into the metal capping layer and the boron absorption layer and to diffuse at least a portion of boron atoms contained in the first magnetic layer into the boron absorption layer.

13. The method of claim 12, wherein the metal capping layer comprises at least one of magnesium, aluminum, scandium, titanium, vanadium, chromium, manganese, niobium, tungsten, and tantalum.

14. The method of claim 12, wherein the oxygen donor layer is formed directly on the substrate using a radio frequency (RF) sputtering process,
wherein the oxygen donor layer comprises at least one of magnesium oxide, aluminum oxide, titanium oxide, vanadium oxide, tungsten oxide, tantalum oxide, hafnium oxide, zirconium oxide, platinum oxide, iridium oxide, ruthenium oxide, lead oxide, palladium oxide, osmium oxide, rhodium oxide, and rhenium oxide.

15. The method of claim 12, wherein forming the oxygen donor layer comprises:
forming a metal layer on the substrate; and
oxidizing the metal layer,
wherein the metal layer comprises at least one of platinum, iridium, ruthenium, lead, palladium, osmium, rhodium, and rhenium.

16. The method of claim 12, wherein the boron absorption layer comprises at least one of titanium, hafnium, zirconium, and tantalum.

17. The method of claim 12, wherein the metal capping layer and the boron absorption layer are oxidized as a result of the heat treatment process to provide an oxidized metal capping layer and an oxidized boron absorption layer,
wherein the oxidized metal capping layer comprises metal oxide having a non-stoichiometric composition ratio, and the oxidized boron absorption layer comprises metal boron oxide having a non-stoichiometric composition ratio.

18. A method for manufacturing a magnetic tunnel junction for a magnetic memory device, the method comprising:
forming an interlayer dielectric layer on a substrate;
forming at least one contact plug to penetrate the interlayer dielectric layer;
sequentially forming a first magnetic layer, a tunnel barrier layer, and a second magnetic layer on the interlayer dielectric layer and the at least one contact plug;
forming a boron absorption layer on the second magnetic layer;
sequentially forming a metal capping layer and an oxygen donor layer on the boron absorption layer, the metal capping layer having a greater oxygen diffusivity than the oxygen donor layer; and
performing a heat treatment process to diffuse at least a portion of oxygen atoms contained in the oxygen donor layer into the metal capping layer and the boron absorption layer.

19. The method of claim 18, wherein at least a portion of boron atoms contained in the second magnetic layer diffuse into the boron absorption layer as a result of the heat treatment process.

20. The method of claim 18, further comprising an additional heat treatment process, wherein the additional heat treatment process is performed before forming the metal capping layer and the oxygen donor layer, wherein at least a portion of boron atoms, contained in the second magnetic layer, diffuse into the boron absorption layer as a result of the additional heat treatment process.

* * * * *